(12) United States Patent
Kyung et al.

(10) Patent No.: US 7,877,664 B2
(45) Date of Patent: Jan. 25, 2011

(54) APPARATUS AND METHOD FOR TRANSMITTING/RECEIVING SIGNAL IN COMMUNICATION SYSTEM

(75) Inventors: Gyu bum Kyung, Suwon-si (KR); Seung-Hoon Choi, Suwon-si (KR); Hong-Sil Jeong, Seoul (KR); Jae-Yoel Kim, Suwon-si (KR); Chi-Woo Lim, Suwon-si (KR); Sung-Eun Park, Seoul (KR); Young-Kyun Kim, Seongnam-si (KR); Dong-Seek Park, Yongin-si (KR); Se-Ho Myung, Pohang-si (KR); Kyeong-Cheol Yang, Pohang-si (KR)

(73) Assignees: Samsung Electronics Co., Ltd (KR); Postech Foundation (KR)

( * ) Notice: Subject to any disclaimer, the term of this patent is extended or adjusted under 35 U.S.C. 154(b) by 1045 days.

(21) Appl. No.: 11/653,724

(22) Filed: Jan. 16, 2007

(65) Prior Publication Data
US 2007/0204198 A1 Aug. 30, 2007

(30) Foreign Application Priority Data
Jan. 13, 2006 (KR) .................... 10-2006-0004146

(51) Int. Cl.
*H03M 13/00* (2006.01)
(52) U.S. Cl. ...................... 714/758; 714/752

(58) Field of Classification Search ............... 714/752, 714/758
See application file for complete search history.

(56) References Cited

FOREIGN PATENT DOCUMENTS
WO   WO 2004/028074   4/2004

OTHER PUBLICATIONS

Djordjevic et al. Affine Geometry LDPC codes in Ultra-Long Optical Transmission Systems, Oct. 2003. TELSIKS IEEE 2003, pp. 75-78.*
Kou et al. Low Denisty Parity Codes Based on Finite Geometries: A Redisvoery and New Results. IEEE transavtion on information theory, 2003 vol. 47, No. 7, pp. 1-50.*

* cited by examiner

*Primary Examiner*—Sam Rizk
(74) *Attorney, Agent, or Firm*—The Farrell Law Firm, LLP

(57) ABSTRACT

Disclosed is an apparatus and a method for transmitting/receiving a signal in a communication system, which generates an Affine Permutation Matrix-Low Density Parity Check (APM-LDPC) codeword by encoding an information vector in an APM-LDPC encoding scheme which is a preset structured LDPC encoding scheme, and detects the information vector by decoding the signal in a decoding scheme corresponding to the APM-LDPC encoding scheme, thereby making it possible to generate a Low Density Parity Check (LDPC) code in the form of maximizing a girth while minimizing complexity.

10 Claims, 3 Drawing Sheets

| $P^a{}_{11}$ | $P^a{}_{12}$ | $P^a{}_{13}$ | $P^a{}_{14}$ | ... | $P^a{}_{1(q-1)}$ | $P^a{}_{1q}$ |
|---|---|---|---|---|---|---|
| $P^a{}_{21}$ | $P^a{}_{22}$ | $P^a{}_{23}$ | $P^a{}_{24}$ | ... | $P^a{}_{2(q-1)}$ | $P^a{}_{2q}$ |
| $P^a{}_{31}$ | $P^a{}_{32}$ | $P^a{}_{33}$ | $P^a{}_{34}$ | ... | $P^a{}_{3(q-1)}$ | $P^a{}_{3q}$ |
| ⋮ | ⋮ | ⋮ | ⋮ | ... | ⋮ | ⋮ |
| $P^a{}_{p1}$ | $P^a{}_{p2}$ | $P^a{}_{p3}$ | $P^a{}_{p4}$ | ... | $P^a{}_{p(q-1)}$ | $P^a{}_{pq}$ |

APPARATUS AND METHOD FOR TRANSMITTING/RECEIVING SIGNAL IN COMMUNICATION SYSTEM

PRIORITY

This application claims priority to an application filed in the Korean Industrial Property Office on Jan. 13, 2006 and assigned Serial No. 2006-004146, the contents of which are incorporated herein by reference.

BACKGROUND OF THE INVENTION

1. Field of the Invention

The present invention relates to an apparatus and a method for transmitting/receiving a signal in a communication system, and more particularly to an apparatus and a method for transmitting/receiving a signal by using an Affine Permutation Matrix (APM)-Low Density Parity Check (LDPC) code, which is an improved structured LDPC code, in a communication system.

2. Description of the Related Art

Next-generation communication systems have evolved into the form of a packet service communication system for transmitting burst packet data to a plurality of Mobile Stations (MS), and the packet service communication system has been designed to be suitable for mass data transmission. Further, next-generation communication systems are actively considering using an LDPC code, together with a turbo code. The LDPC code is known to have an excellent performance gain at high-speed data transmission, and has an advantage in that it can enhance data transmission reliability by effectively correcting errors due to noise occurring in a transmission channel.

Reference will now be made to FIG. 1, which illustrates the structure of a signal transmission apparatus in a conventional communication system using an LDPC code.

Referring to FIG. 1, the signal transmission apparatus includes an encoder 111, a modulator 113 and a transmitter 115. First, if an information vector $\underline{s}$ to be transmitted occurs in the signal transmission apparatus, the information vector $\underline{s}$ is delivered to the encoder 111. The encoder 111 generates a codeword vector $\underline{c}$, that is, a non-binary LDPC codeword, by encoding the information vector $\underline{s}$ in a predetermined encoding scheme, and then outputs the generated codeword vector $\underline{c}$ to the modulator 113. Here, the predetermined encoding scheme corresponds to a non-binary LDPC encoding scheme. The modulator 113 generates a modulation vector $\underline{m}$ by modulating the codeword vector $\underline{c}$ in a predetermined modulation scheme, and then outputs the generated modulation vector $\underline{m}$ to the transmitter 115. The transmitter 115 inputs therein the modulation vector $\underline{m}$ output from the modulator 113, executes transmission signal processing for the input modulation vector m, and then transmits the processed modulation vector $\underline{m}$ to a signal reception apparatus through an antenna.

Next, reference will be made to FIG. 2, which illustrates the structure of a signal reception apparatus in a conventional communication system using an LDPC code.

Referring to FIG. 2, the signal reception apparatus includes a receiver 211, a demodulator 213 and a decoder 215. First, a signal transmitted by a signal transmission apparatus, such as shown in FIG. 1, is received through an antenna of the signal reception apparatus, and the received signal is delivered to the receiver 211. The receiver 211 executes reception signal processing for the received signal to thereby generate a reception vector $\underline{r}$, and then outputs the processed and generated reception vector $\underline{r}$ to the demodulator 213. The demodulator 213 inputs therein the reception vector $\underline{r}$ output from the receiver 211, generates a demodulation vector $\underline{x}$ by demodulating the input reception vector $\underline{r}$ in a demodulation scheme corresponding to a modulation scheme applied to a modulator of the signal transmission apparatus (that is, the modulator 113), and then outputs the generated demodulation vector $\underline{x}$ to the decoder 215. The decoder 215 inputs therein the demodulation vector $\underline{x}$ output from the demodulator 213, decodes the input demodulation vector $\underline{x}$ in a decoding scheme corresponding to an encoding scheme applied to an encoder of the signal transmission apparatus (that is, the encoder 111), and then outputs the decoded demodulation vector $\underline{x}$ into a finally restored information vector $\hat{\underline{s}}$.

Meanwhile, the LDPC code has performance approximating a channel capacity limit presented in Shannon's channel coding theorem. In order to generate an LDPC code having such good performance, a cycle and a density distribution on the Tanner graph of an LDPC code must be considered, and particularly consideration must be given to maximizing a girth on the Tanner graph. Here, "girth" denotes a minimum cycle length on the Tanner graph of a parity check matrix of the LDPC code. The reason why consideration must be given to maximizing the girth on the Tanner graph is that a cycle on the Tanner graph must be generally longer in order not to cause performance deterioration, such as an error floor, which occurs when there are many comparatively short-length cycles (for example, cycles having a length of 4), on the Tanner graph.

Thus, research is being conducted to provide schemes for generating a parity check matrix in such a manner so as not to produce short-length cycles on the Tanner graph, two typical ones of which are Scheme 1, in which short-length cycles are removed from a given random LDPC code, and Scheme 2, in which an LDPC code with no short-length cycle is algebraically generated. Scheme 2 is mainly used from these two schemes because the memory capacity required for storing parity check matrixes is large, and it is difficult to implement efficient LDPC encoding in the case of Scheme 1. Here, an LDPC code generated by applying Scheme 2 is called a structured LDPC code, and reference will now be made to a parity check matrix of a general structured LDPC code, with reference to FIG. 3.

As illustrated in FIG. 3, the parity check matrix of a general structured LPDC code has a structure in which the overall parity check matrix is divided into a plurality of blocks, and a permutation matrix corresponds to each block. Here, it is assumed that the permutation matrix has a size of L×L. As seen from FIG. 3, the parity check matrix of the structured LDPC code is divided into (p×q) number of blocks, and a permutation matrix corresponds to each block. In FIG. 3, $P^{a_{pq}}$ indicates a permutation matrix located at an intersection point of a pth block row and a qth block column among the plurality of blocks. Here, the superscript "$a_{pq}$" is $0 \leq a_{pq} \leq 1$ or $a_{pq} = \infty$.

Further, the permutation matrix corresponding to each block is referred to as a "block matrix". In the case where the respective block matrixes within the parity check matrix are selected to only an identity matrix, if the location of a non-zero element in the first row of each block matrix is determined, then the locations of the remaining non-zero elements, that is, (L−1) number of elements, are determined. Thus, the memory capacity required for storing information on the overall parity check matrix is reduced to 1/L, as compared with that in the case where the locations of non-zero elements irregularly distributed in each block matrix are selected, that is, in the case where an LDPC code is generated by applying Scheme 1.

It can be noted from the foregoing that the structured LDPC code has improved performance by considering not only the memory capacity required for storing parity check matrix information, but also efficient encoding. However, the structured LDPC code which is currently proposed in the art has a drawback in that its cycle is affected by a parent matrix thereof, and an upper limit is restricted by several numerals related to its parent matrix irrespective of which code length and permutation matrixes are selected.

SUMMARY OF THE INVENTION

Accordingly, the present invention has been made to solve at least the above-mentioned problems occurring in the prior art, and an object of the present invention is to provide an apparatus and a method for transmitting/receiving a signal in a communication system.

A further object of the present invention is to provide an apparatus and a method for transmitting/receiving a signal using a structured LDPC code in a communication system.

A further object of the present invention is to provide an apparatus and a method for transmitting/receiving a signal using an APM-LDPC code, which is an improved structured LDPC code, in a communication system.

In order to accomplish these objects, the present invention generates an APM-LDPC codeword by encoding an information vector in an APM-LDPC encoding scheme, which is a preset structured LDPC encoding scheme, thereby making it possible to generate an LDPC code in the form of maximizing a girth while minimizing complexity.

BRIEF DESCRIPTION OF THE DRAWINGS

The above and other objects, features and advantages of the present invention will be more apparent from the following detailed description taken in conjunction with the accompanying drawings, in which:

FIG. 3 is a view illustrating a parity check matrix of a general structured LDPC code;

DETAILED DESCRIPTION OF THE PREFERRED EMBODIMENT

Figure 1:
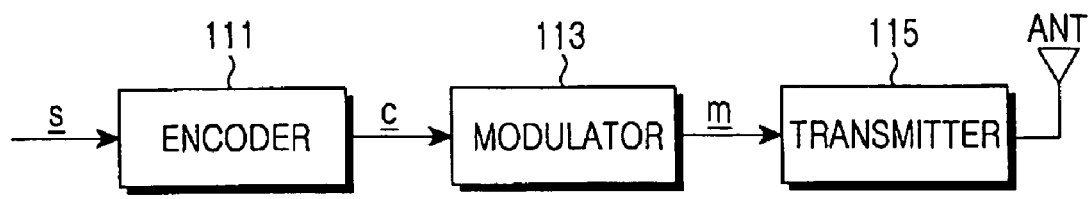
FIG. 1 is a block diagram illustrating the structure of a signal transmission apparatus in a conventional communication system using an LDPC code.

Hereinafter, preferred embodiments of the present invention will be described with reference to the accompanying drawings. It should be noted that the similar components are designated by similar reference numerals although they are illustrated in different drawings. Also, in the following description, a detailed description of known functions and configurations incorporated herein will be omitted when it may obscure the subject matter of the present invention. Further, it should be noted that only parts essential for understanding the operations according to the present invention will be described and a description of parts other than the essential parts will be omitted in order not to obscure the present invention.

Figure 2:
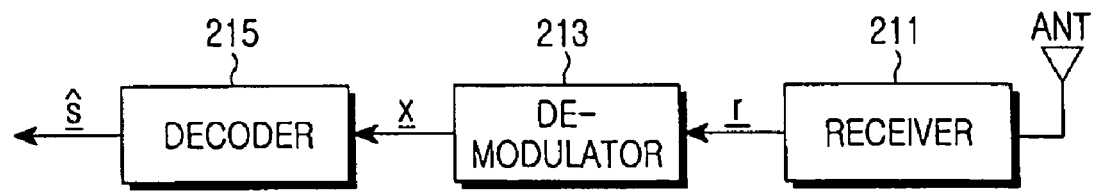
FIG. 2 is a block diagram illustrating the structure of a signal reception apparatus in a conventional communication system using an LDPC code.

The present invention provides an apparatus and a method for transmitting/receiving a signal in a communication system. Further, the present invention provides an apparatus and a method for transmitting/receiving a signal using an Affine Permutation Matrix ("APM")-Low Density Parity Check ("LDPC") code, which is an improved structured LDPC code, in a communication system. Further, although separately described and illustrated herein, it is clear that a procedure of transmitting a signal using the APM-LDPC code of the present invention may be applied to a signal transmission apparatus of a communication system, which has a structure as illustrated in FIG. 1, and a procedure of receiving a signal by using the APM-LDPC code of the present invention may be applied to a signal reception apparatus of a communication system, which has a structure as illustrated in FIG. 2.

First, assume that $Z_L = \{0, 1, \ldots, L-1\}$ is an integer ring of modulo L, and $Z^*_L = \{i \in Z_L | \gcd(i,L)=1\}$. Further, for $a \in Z^*_L$ and $b \in Z_L$, an Affine function $f_{(a,b)}$ on $Z_L$, which is defined by $f_{(a,b)}(x)=ax+b$, can be considered. The Affine function $f_{(a,b)}$ can also be extended to an L×L permutation matrix $P^{f_{(a,b)}}$ whose (i, j)th element is defined as the following Equation (1):

$$[P^{f_{(a,b)}}] = \begin{cases} 1 & \text{if } j = f_{(a,b)}(i) \\ 0 & \text{otherwise} \end{cases} \quad (1)$$

Hereinafter, for the convenience of explanation, the permutation matrix $P^{f_{(a,b)}}$ is referred to as an "Affine permutation matrix", and an L×L zero matrix, a set of Affine functions on $Z_L$ and a set of L×L Affine permutation matrixes, including the L×L zero matrix, will be designated by $P^\infty$, $A_L$ and $P_L$, respectively.

Consider an LDPC code C whose length is nL and which has a parity check matrix H as given in the following Equation (2):

$$H = \begin{bmatrix} P^{f_{11}} & P^{f_{12}} & \cdots & P^{f_{1n}} \\ P^{f_{21}} & P^{f_{22}} & \cdots & P^{f_{2n}} \\ \vdots & \vdots & \cdots & \vdots \\ P^{f_{m1}} & P^{f_{m2}} & \cdots & P^{f_{mn}} \end{bmatrix} \quad (2)$$

In Equation (2), $f_{ij}$ has a value of an Affine function related to $(a_{ij}, b_{ij}) \in Z^*_L \times Z_L$ for i and j or a value of $\infty$.

A structured LDPC code generated by applying the parity check matrix H including Affine permutation matrixes is referred to as an "APM-LDPC code". Here, if the exponent $a_{ij}$ of the Affine permutation matrix is equal to 1, $p^{f_{ij}}$ denotes a circulant permutation matrix. Further, an APM-LDPC code satisfying $a_{ij}=1$ for all i and j is called a Quasi-Cyclic (QC) LDPC code. Further, for a fixed $(a_j, b_j)$, the locations of all non-zero elements $P^{f_{ij}}$, for example, the locations of elements having a value of 1, are uniquely determined. Thus, the memory capacity required for storing the parity check matrix of the APM-LDPC code is reduced to 1/L, as compared with that of a randomly-configured LDPC code.

For the purpose of this discussion, several terms are defined below:

(1) Parent Matrix

An m×n binary matrix M(H) can be generated by substituting zero matrixes and Affine permutation matrixes, included in a parity check matrix as expressed by Equation (2), with 0 and 1, respectively, and the matrix generated in this way is referred to as a "parent matrix".

(2) Function Matrix

A function matrix F(H) of the above-mentioned parity check matrix H may be defined by the following Equation (3):

$$F(H) = \begin{bmatrix} f_{11} & f_{12} & \cdots & f_{1n} \\ f_{21} & f_{22} & \cdots & f_{2n} \\ \vdots & \vdots & \cdots & \vdots \\ f_{m1} & f_{m2} & \cdots & f_{mn} \end{bmatrix} \quad (3)$$

(3) Function Extension

The parity check matrix H is generated by extending an m×n function matrix to an m×n matrix defined on $P_L$, and such an extension procedure, expressed by $H=E_L(F)$, is referred to as a "function extension" procedure.

(4) Block Cycle and Overlap

If a cycle with a length of 2l exists on the Tanner graph of the parent matrix M(H), then such a cycle is referred to as a "2l-sized block cycle". Further, if one Affine permutation matrix belongs to two or more block cycles, then this is referred to as an "overlap between block cycles".

(5) Function Chain

If a 2l-sized block cycle corresponding to 2l number of Affine permutation matrixes $P^{f_1}, P^{f_2}, \ldots, P^{f_{2l}}$ exists in the parity check matrix H within the parent matrix M(H), then $(f_1, \ldots, f_{2l})$ is referred to as a function chain. Further, for $1 \leq i \leq 2l$, $P^{f_i}$ and $P^{f_{i+1}}$ are located in the same row or column block of the parity check matrix H, and $P^{f_i}$ and $P^{f_{i+2}}$ are located in different row and column blocks of the parity check matrix H. Here, $P^{f_{2l+1}} = P^{f_1}$, and $P^{f_{2l+2}} = P^{f_2}$.

(6) Connected Block Cycle

Figure 4:
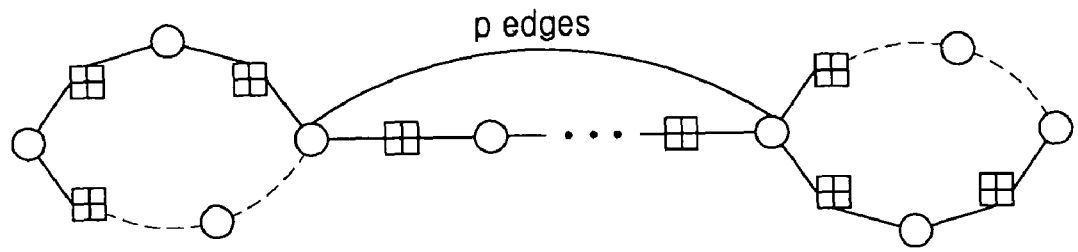
FIG. 4 is a view illustrating connected block cycles on the Tanner graph in accordance with the present invention.

Reference will now be made to FIG. 4, which illustrates connected block cycles on the Tanner graph according to the present invention.

As illustrated in FIG. 4, when two different block cycles are connected with each other by p number of edges, which are connected one after another, on the Tanner graph of an m×n binary matrix M(H), it can be said that they are connected with each other by p number of blocks corresponding to the connected edges. In particular, if p=0, the block cycles share one bit or check node within the m×n binary matrix M(H), which is referred to as "directly connected".

(7) Composition of Functions

Given $f_j$, $1 \leq i \leq s$, a composition sequence can be defined by the following Equation (4):

$$\bigodot_{i=1}^{s} f_i(x) \triangleq f_s \cdot f_{s-1} \cdot \ldots \cdot f_1(x) \quad (4)$$

In Equation (4), "○" is a symbol indicating composition of functions. Here, $f \circ g(x) = f(g(x))$. If $f_i = f$ for all i, then this is abbreviated to $f^s(x)$, and $f^1(x)$ is an inverse function of $f(x)$.

For the convenience of explanation, an operation as given in the following Equation (5) is now defined:

$$\bigotimes_{i=j}^{s} f_i(x) \triangleq f_s^{(-1)^{s-i+1}} \cdot \ldots \cdot f_{j+2}^{-1} \cdot f_{j+1} \cdot f \quad (5)$$

(8) Characteristic Function of Function Chain

For a given function chain $(f_1, \ldots, f_{2l})$, its characteristic function z(x) is defined as $$\bigotimes_{i=1}^{2l} f_i(x),$$

and if all $f_i(x)$ are Affine functions, then the characteristic function z(x) is also an Affine function.

Next, reference will be made to cycle properties of the APM-LDPC code.

Owing to the inherent structure of the APM-LDPC code's parity check matrix, the cycle properties of the APM-LDPC code can be algebraically analyzed with ease. Now, an upper limit for a girth of the APM-LDPC code will be detected, and the detected upper limit will be described in comparison with the upper limit of a QC-LDPC code. Here, the girth indicates a minimum cycle length on the Tanner graph of a parity check matrix.

First, Theorem 1, as will be described below, presents the necessary and sufficient condition under which the APM-LDPC code has a cycle.

Theorem 1

It is assumed that $(f_1, \ldots, f_{2l})$ is a function chain which corresponds to a 2l-sized block cycle of an APM-LDPC code, and has a parity check matrix H and a characteristic function z(x). Further, let r be a minimum positive integer satisfying the following Equation (6):

$$z^r(x_0) = x_0 \bmod L \quad (6)$$

In Equation (6), $x_0 \in Z_L$, and thus the block cycle corresponds to a cycle which has a length of 2lr on the Tanner graph of the APM-LDPC code.

Further, when $z(x) = ax + b$ for $(a,b) \in Z^*_L \times Z_L$, $z^r(x) = a^r x + (a^{r-1} + \ldots + a + 1)b$. Thus, a solution $x_0$ satisfying $z^r(x_0) = x_0$ exists, which is identical to $\gcd(a^r - 1, L) | (a^{r-1} + a^{r-2} + \ldots + a + 1)b$. When a=1, Equation (6) is under the same condition as rb≡0 mod L. Further, since the QC-LDPC code is an LDPC code having an Affine function in the form of $f_{ij}(x) = x + b_{ij}$, Theorem 2 can be defined as follows:

Theorem 2

It is assumed that $(f_1, \ldots, f_{2l})$ is a function chain which corresponds to a 2l-sized block cycles of an QC-LDPC code and has $f_i(x) = x + b_i$, and that r is a minimum positive integer satisfying the following Equation (7):

$$r \sum_{i=1}^{2l} (-1)^i b_i \equiv 0 \bmod L \quad (7)$$

Thus, the block cycle is a cycle which has a length of 2lr on the Tanner graph of the QC-LDPC code.

Using Theorems 1 and 2, cycles of the APM-LDPC code and the QC-LDPC code can be expressed by a simple equation, which makes it possible to remove short-length cycles on the Tanner graph. This will be described below.

First of all, it is assumed that matrixes, as given in the following Equation (8), exist:

$$F_1 = \begin{bmatrix} 2x+1 & 3x \\ 5x & 4x \end{bmatrix},$$

$$F_2 = \begin{bmatrix} 2x+3 & 3x+1 \\ 4x+5 & x+1 \end{bmatrix},$$

$$F_3 = \begin{bmatrix} x & 3x \\ 5x+1 & 3x \end{bmatrix}$$

(8)

In Equation (8), $F_1$ and $F_2$ are defined in $A_7$, and $F_3$ is defined in $A_8$. Further, for the matrixes, each function chain corresponding to a 4-sized block cycle can be expressed by the following Equation (9):

$$F_1:(2x+1,3x,4x,5x), F_2:(2x+3,3x+1,x+1,4x+5), F_3:(x,3x,3x,5x+1) \quad (9)$$

Thus, each characteristic function corresponding to each of the function chains can be expressed by the following Equation (10):

$$z_1(x)=x+6, z_2(x)=6x+1, z_3(x)=5x+1 \quad (10)$$

In the case of $z_1(x)$ in Equation (10), the minimum positive integer satisfying Equation (6) is r=7, which indicates a cycle having a size of 4×7=28 on the Tanner graph $H_1=E_7(F_1)$. Further, in the case of $z_2(x)$ in Equation (10), the minimum positive integer satisfying Equation (6) for x=4 is r=1, and for the remaining x, the minimum positive integer satisfying Equation (6) is r=2, which indicates that one cycle with a size of 4 and three cycles with a size of 8 exist on the Tanner graph $H_2=E_7(F_2)$. Further, in the case $z_3(x)$ in Equation (10), the minimum positive integer satisfying Equation (6) is r=8, which indicates that one cycle with a size of 32 exists on the Tanner graph $H_3=E_8(F_3)$.

In addition, although the cycle structure of the QC-LDPC code is greatly affected by the parent matrix, the APM-LDPC code is less affected by the parent matrix when compared with the QC-LDPC code, which can be demonstrated using Theorem 3.

Theorem 3

It is assumed that p number of overlaps exist between a 2l-sized block cycle and a 2k-sized block cycle in an APM-LDPC code defined by an L×L Affine permutation matrix, and that function chains as given in the following Equation (11) correspond to the block cycles, respectively:

function chain 1: $(f_1, f_2, \ldots, f_p, f_{p+1}, f_{2l})$ function chain 2: $(g_1, g_2, \ldots, g_p, g_{p+1}, \ldots, g_{2k})$ (11)

In Equation (11), $f_i=g_j$ for i=1, 2, . . . , p. Further, it is assumed that function chains 1 and 2 have characteristic functions of $z_1(x)=a_1x+b_1$ and $z_2(x)=a_2x+b_2$, respectively. Further, if it is assumed that r is a minimum positive integer satisfying $r(b_1-b_2+a_1b_2-a_2b_1) \equiv 0 \mod L$, the minimum cycle of the APM-LDPC code is 2r(2l+2k−p).

Irrespective of the size of the Affine permutation matrix, cycles caused by the overlaps between the block cycles may exist in the Tanner graph of the APM-LDPC code. Thus, if it is possible to remove as many block cycle overlaps as possible from a parent matrix, many short-length cycles in a corresponding parity check matrix can be avoided. However, even if there is no overlap between block cycles, the upper limit of a girth is restricted by numerals related to two connected block cycles.

Theorem 4

Figure 5:
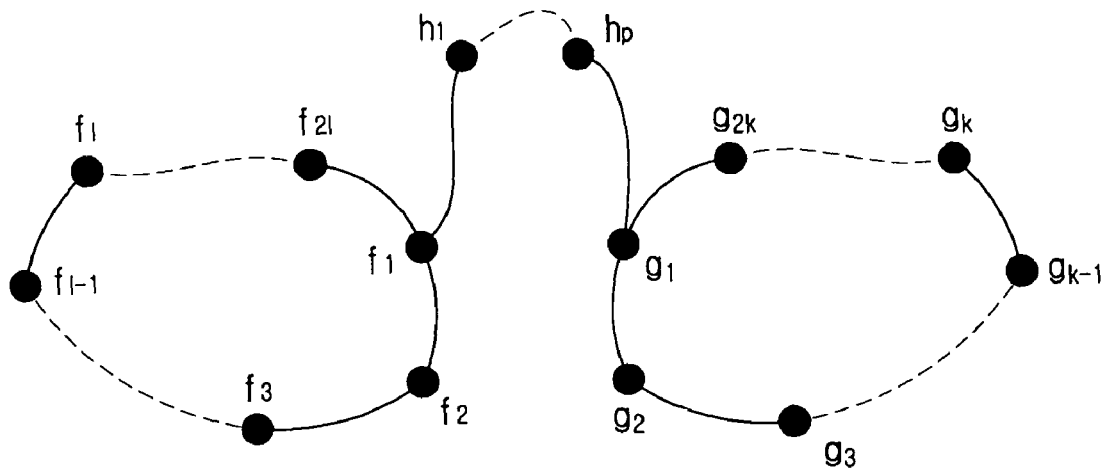
FIG. 5 is a view illustrating function chains of two different block cycles connected with each other by p number of blocks on the Tanner graph in accordance with the present invention.

FIG. 5 illustrates function chains of two different block cycles connected with each other by p number of blocks on the Tanner graph according to the present invention.

As illustrated in FIG. 5, it is assumed that two different block cycles, whose sizes are 2l and 2k, respectively, are connected with each other by p number of blocks in an APM-LDPC code. Here, respective function chains corresponding to the block cycles are given as represented by the following Equation (12):

function chain 1: $(f_1, f_2, \ldots, f_{2l})$ function chain 2: $(g_1, g_2, \ldots, g_{2k})$ (12)

Further, it is assumed that the connected blocks are $(P^{h_1}, P^{h_2}, \ldots P^{h_p})$, $z_i(x)=a_ix+b_i$ is a characteristic function of function chain i, $$\bigodot_{i=1}^{p} h_i^{(-1)^j}(x) = a_3x+b_3 \text{ and } \bigodot_{i=1}^{2k} g_i^{(-1)^{j+p}}(x) = a_4x+b_4.$$

Further, let r be a minimum positive integer satisfying the following Equation (13):

$$r(a_3b_1(a_4-1)-b_4(a_1-1)-b_3(a_1-1)(a_4-1)) \equiv 0 \mod L,$$
when $p \geq 1$ $$r(b_1-b_2+a_1b_2-a_2b_1) \equiv 0 \mod L, \text{ when } p=0 \quad (13)$$

In this case, a girth of the corresponding APM-LDPC code is 4r(l+k+p).

Theorem 5

If it is assumed that for a prime number L, two different block cycles, whose sizes are 2l and 2k, respectively, are connected with each other by p number of blocks in a parity check matrix of an APM-LDPC code defined by an L×L Affine permutation matrix, a girth of the APM-LDPC code is 4(l+k+p).

As described above, the present invention has an advantage in that it is possible to transmit/receive a signal using an APM-LDPC code. Further, the present invention makes it possible to generate an APM-LDPC code corresponding to an LDPC code which maximizes a girth while minimizing complexity, thereby providing an APM-LDPC code with superior performance.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for transmitting a signal in a communication system, the method comprising:
   inputting an information vector; and
   generating a Low Density Parity Check (LDPC) codeword by encoding the input information vector in an Affine Permutation Matrix-Low Density Parity Check (APM-LDPC) encoding scheme,
   wherein the APM-LDPC encoding scheme is a scheme in which the information vector is encoded corresponding to a parity check matrix, and the parity check matrix includes (p×q) number of blocks, to each of which an L×L-sized Affine permutation matrix corresponds.

2. The method as claimed in claim 1, further comprising transmitting the generated LDPC codeword.

3. The method as claimed in claim 1, wherein the Affine permutation matrix is expressed as:

$$[P^{f_{(a,b)}}] = \begin{cases} 1 & \text{if } f = f_{(a,b)}(i) \\ 0 & \text{otherwise} \end{cases}$$

where, $P^{f_{(a,b)}}$ denotes the Affine permutation matrix, i and j denote a row index and a column index of the Affine permutation matrix, respectively, $f_{(a,b)}$ denotes an Affine function on $Z_L = \{0, 1, \ldots, L-1\}$, $Z_L$ is an integer ring of modulo L, and when $Z^*_L = \{i \in Z_L | \gcd(i,L)=1\}$, gcd is a greatest common divisor, $Z_L^*$ is a conjugate of $Z_L$, the Affine function $f_{(a,b)}$ is defined by $f_{(a,b)}(x) = ax + b$, $a \in Z^*_L$ and $b \in Z_L$.

4. An apparatus for transmitting a signal in a communication system, the apparatus comprising:
an encoder for inputting therein an information vector and generating a Low Density Parity Check (LDPC) codeword by encoding the input information vector in an Affine Permutation Matrix-Low Density Parity Check (APM-LDPC) encoding scheme,
wherein the APM-LDPC encoding scheme is a scheme in which the information vector is encoded corresponding to a parity check matrix, and the parity check matrix includes (p×q) number of blocks, to each of which an L×L-sized Affine permutation matrix corresponds.

5. The apparatus as claimed in claim 4, further comprising a transmitter for transmitting the generated LDPC codeword.

6. The apparatus as claimed in claim 4, wherein the Affine permutation matrix is expressed as:

$$[P^{f_{(a,b)}}] = \begin{cases} 1 & \text{if } f = f_{(a,b)}(i) \\ 0 & \text{otherwise} \end{cases}$$

where, $P^{f_{(a,b)}}$ denotes the Affine permutation matrix, i and j denote a row index and a column index of the Affine permutation matrix, respectively, $f_{(a,b)}$ denotes an Affine function on $Z_L = \{0, 1, \ldots, L-1\}$, $Z_L$ is an integer ring of modulo L, and when $Z^*_L = \{i \in Z_L | \gcd(i,L)=1\}$, gcd is a greatest common divisor, $Z_L^*$ is a conjugate of $Z_L$, the Affine function $f_{(a,b)}$ is defined by $f_{(a,b)}(x) = ax + b$, $a \in Z^*_L$ and $b \in Z_L$.

7. A method for receiving a signal in a communication system, the method comprising:
receiving a signal; and
detecting an information vector by decoding the received signal in a decoding scheme corresponding to an Affine Permutation Matrix-Low Density Parity Check (APM-LDPC) encoding scheme applied in a transmitter side,
wherein the APM-LDPC encoding scheme is a scheme in which the information vector is encoded corresponding to a parity check matrix, and the parity check matrix includes (p×q) number of blocks, to each of which an L×L-sized Affine permutation matrix corresponds.

8. The method as claimed in claim 7, wherein the Affine permutation matrix is expressed as:

$$[P^{f_{(a,b)}}] = \begin{cases} 1 & \text{if } j = f_{(a,b)}(i) \\ 0 & \text{otherwise} \end{cases}$$

where, $P^{f_{(a,b)}}$ denotes the Affine permutation matrix, i and j denote a row index and a column index of the Affine permutation matrix, respectively, $f_{(a,b)}$ denotes an Affine function on $Z_L = \{0, 1, \ldots, L-1\}$, $Z_L$ is an integer ring of modulo L, and when $Z^*_L = \{i \in Z_L | \gcd(i,L)=1\}$, gcd is a greatest common divisor, $Z_L^*$ is a conjugate of $Z_L$, the Affine function $f_{(a,b)}$ is defined by $f_{(a,b)}(x) = ax + b$, $a \in Z^*_L$ and $b \in Z_L$.

9. An apparatus for receiving a signal in a communication system, the apparatus comprising:
a receiver unit for receiving a signal; and
a decoder for detecting an information vector by decoding the received signal in a decoding scheme corresponding to an Affine Permutation Matrix-Low Density Parity Check (APM-LDPC) encoding scheme applied in a transmitter side,
wherein the APM-LDPC encoding scheme is a scheme in which the information vector is encoded corresponding to a parity check matrix, and the parity check matrix includes (p×q) number of blocks, to each of which an L×L-sized Affine permutation matrix corresponds.

10. The apparatus as claimed in claim 9, wherein the Affine permutation matrix is expressed as:

$$[P^{f_{(a,b)}}] = \begin{cases} 1 & \text{if } f = f_{(a,b)}(i) \\ 0 & \text{otherwise} \end{cases}$$

where, $P^{f_{(a,b)}}$ denotes the Affine permutation matrix, i and j denote a row index and a column index of the Affine permutation matrix, respectively, $f_{(a,b)}$ denotes an Affine function on $Z_L = \{0, 1, \ldots, L-1\}$, $Z_L$ is an integer ring of modulo L, and when $Z^*_L = \{i \in Z_L | \gcd(i,L)=1\}$, gcd is a greatest common divisor, $Z_L^*$ is a conjugate of $Z_L$, the Affine function $f_{(a,b)}$ is defined by $f_{(a,b)}(x) = ax + b$, $a \in Z^*_L$ and $b \in Z_L$.

* * * * *